United States Patent [19]
Ito et al.

[11] Patent Number: 5,652,067
[45] Date of Patent: Jul. 29, 1997

[54] ORGANIC ELECTROLUMINESCENT DEVICE

[75] Inventors: Yuichi Ito; Noritoshi Tomikawa; Takao Minato; Mitsunori Sugihara; Hisaya Sato, all of Tokyo, Japan

[73] Assignee: Toppan Printing Co., Ltd., Tokyo, Japan

[21] Appl. No.: 99,556

[22] Filed: Jul. 30, 1993

[30] Foreign Application Priority Data

Sep. 10, 1992 [JP] Japan .................... 4-242041
Nov. 11, 1992 [JP] Japan .................... 4-300885

[51] Int. Cl.$^6$ .................... H05B 33/04
[52] U.S. Cl. .................... 428/690; 428/691; 428/917; 313/501; 313/500; 313/502; 313/503; 313/504; 313/505; 313/506
[58] Field of Search .................... 428/690, 691, 428/917; 313/500–506

[56] References Cited

U.S. PATENT DOCUMENTS

| | | | |
|---|---|---|---|
| 4,326,007 | 4/1982 | Williams et al. | 428/333 |
| 4,356,429 | 10/1982 | Tang | 313/503 |
| 4,539,507 | 9/1985 | VanSlyke et al. | 313/504 |
| 4,720,432 | 1/1988 | VanSlyke et al. | 428/457 |
| 4,767,679 | 8/1988 | Kawachi | 428/690 |
| 4,885,211 | 12/1989 | Tang et al. | 428/457 |
| 5,189,549 | 2/1993 | Leventis et al. | 359/271 |
| 5,258,690 | 11/1993 | Leksell | 313/512 |

FOREIGN PATENT DOCUMENTS

| | | |
|---|---|---|
| 57-51781 | 3/1982 | Japan . |
| 59-194393 | 11/1984 | Japan . |
| 63-264692 | 11/1988 | Japan . |
| 63-295695 | 12/1988 | Japan . |
| 2-15595 | 1/1990 | Japan . |

OTHER PUBLICATIONS

"Organic electroluminescent diodes", C.W. Tang and S.A. VanSlyke, *Appl. Phys. Lett*, vol. 51, No. 12; Sep. 1987, pp. 913–915.

"Electroluminescence of doped organic thin films", C.W. Tang, S.A. VanSlyke and C.H. Chen, *J. Appl. Phys.*, vol. 65, No. 9, May 1989, pp. 3610–3616.

*Primary Examiner*—Charles R. Nold
*Attorney, Agent, or Firm*—Staas & Halsey

[57] ABSTRACT

In an organic electroluminescent device including a substrate and formed thereon a multilayered structure successively having at least an anode layer, an organic electroluminescent layer and a cathode layer, a sealing layer having at least one compound selected from the group consisting of a metal oxide, a metal fluoride and a metal sulfide is further provided on the electrode layer formed later. A hole injecting and transporting layer is preferably provided between the anode layer and the organic electroluminescent layer. An electron injecting and transporting layer may also be provided between the organic electroluminescent layer and the cathode layer. At least one layer of the hole injecting and transporting layer, organic electroluminescent layer and electron injecting and transporting layer may be formed of a polyphosphazene compound or a polyether compound or a polyphosphate compound having an aromatic tertiary amine group in its main chain.

23 Claims, 6 Drawing Sheets

ORGANIC ELECTROLUMINESCENT DEVICE

BACKGROUND OF THE INVENTION

1. Field of the Invention

This invention relates to an organic electroluminescent (hereinafter abbreviated "EL") device that utilizes electroluminescence of an organic thin film.

2. Description of the Related Art

Conventional EL devices currently prevailing are as those of an alternating-current drive type provided with a highly resistant insulating layer between electrodes. They are roughly grouped into powder EL devices and inorganic thin-film EL devices. The powder EL devices have a laminated structure comprised of an insulating layer formed on an aluminum foil backed electrode in a thickness of several tens of μm. The laminated structure is formed by coating a composition prepared by dispersing a powder with a high dielectric constant such as barium titanate in a resin binder such as cyanoethylpolyvinyl alcohol or cyanoethyl cellulose, an electroluminescent layer containing a zinc sulfide type powder phosphor dispersed in a resin binder, and a transparent electrode formed on a polyethylene terephthalate or glass substrate. Laminated structures of this type can provide surface-emitting devices having a large area and a thickness of 1 mm or less, and are suited to, e.g., back lighting for liquid crystal display. But on the other hand, these laminated structures have the disadvantages that they tend to cause a decrease in luminescence compared with inorganic thin-film types and have so insufficient a threshold value in the applied voltage-luminance characteristics that they have the problem of crosstalk and are not suited to X-Y matrix drive display.

As for the inorganic thin-film EL devices, they have a multilayered structure which includes of a transparent electrode substrate comprising a glass plate coated with indium-tin oxide (hereinafter "ITO") or the like, an yttrium oxide or the like dielectric thin-film layer formed thereon as an insulating layer by sputtering or the like approximately in a thickness of thousands of Å, a ZnS, ZnSe, SrS or CaS type phosphor thin film successively deposited thereon by electron beam deposition, sputtering or the like approximately in a thickness of thousands of Å, and further successively deposited thereon another dielectric thin-film layer and a back electrode made of aluminum or the like. Here, the layer thickness between electrodes is 1 to 2 μm or less. Such thin-film EL devices have a long lifetime and yet can perform highly precise display, and are suited to their use in display for portable computers. They, however, have the disadvantages that they can not be easily designed for full-color display because of a difficulty in the development of blue electroluminescent materials or white electroluminescent materials having a high luminance and a long lifetime, and are expensive.

In either type of the EL devices, there is another disadvantage that a high alternating voltage of 100 V or more must be applied in order to obtain a sufficient luminance. Accordingly, when, for example, an EL device is light-emitted using batteries, a boosting transformer is required. Hence, even when the EL device itself is of a thin type of 1 mm or less, it is difficult to make smaller the thickness of the whole equipment into which the device is incorporated. Also when the X-Y matrix drive is used, there is the problem that the drive circuit becomes expensive since special ICs for high voltages are required.

Now, in recent years, research has been aiming at low-voltage direct-current drive EL devices that require no boosting transformers. As an outcome thereof, organic EL devices are proposed [Japanese Patent Application Laid-open Nos. 57-51781, 59-194393, 63-264692, 63-295695 and 1-292291; U.S. Pat. Nos. 4,356,429, 4,539,507, 4,769,292 and 4,720,432; Japanese Journal of Applied Physics, 25(9),773(1986); Applied Physics Lett., 51(12),913(1987); Journal of Applied Physics, 65(9),3610(1989); etc.]

These organic EL devices commonly have a multilayered structure comprised of a substrate and successively provided thereon an anode, a hole injecting and transporting layer (hereinafter abbreviated "HITL"), an organic electroluminescent layer (hereinafter abbreviated "OEL") and a cathode, and are fabricated in the following way:

On a transparent insulating substrate such as a glass sheet or resin film, a transparent and conductive anode comprising a compound oxide of indium with tin (ITO) is formed by deposition or sputtering.

Next, on the electrode, an HITL comprising copper phthalocyanine (hereinafter "CuPc"), poly(3-methylthiophene) or a tetraphenyldiamine represented by the formula (1), (2) or (3) shown below is formed by vacuum-vapor deposition or the like in a thickness of about 1 μm or less in the form of a single layer or multilayer comprised of a plurality of said materials.

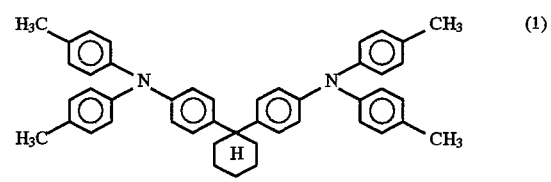

1,1-bis (4-di-p-tolylaminophenyl)cyclohexane (melting point: 181.4° C.–182.4° C.)

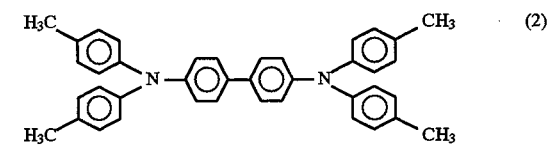

N,N,N',N'-tetra-p-tolyl-1,1'-biphenyl-4,4'-diamine (melting point: 120° C.)

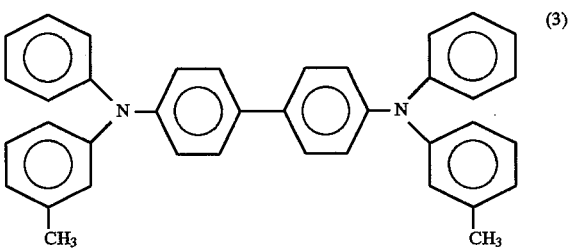

N,N'-diphenyl-N,N'-bis(3-methylphenyl)-1,1'-biphenyl-4,4'-diamine (melting point: 159° C.–163° C.; glass transition point: 67° C., measured by DSC using nitrogen at a rate of temperature rise of 10° C./min; hereinafter "TPD").

Next, on the HITL, an organic phosphor such as tetraphenyl butadiene, anthracene, perylene, coronene, a 12-phthaloperinone derivative, tris(8-quinolinol)aluminum (hereinafter "$Alq_3$") or europium tris (tenoyltrifluoroacetonate)phenanthroline is deposited, or its dispersion in a resin binder is coated, to form the OEL in a thickness of about 1.0 μm or less.

For the purpose of increasing electroluminescent efficiency of the OEL or changing electroluminescent colors, it is also known to dope the $Alq_3$ electroluminescent layer with about 0.5 to 2 mol % of coumarin-6 (a green electroluminescent coloring matter), 4-(dicyanomethylene)-2-methyl-6-(p-dimethylaminostyryl)-4-H-pyran (a reddish yellow electroluminescent coloring matter) or the like.

As a final step, on the OEL, a single metal such as Mg, In or Al, or an Mg-Ag alloy (atomic ratio: 10:1), an Mg-Cu alloy, an Mg-Sn alloy, an Mg-In alloy, an Ag-Eu alloy or the like is deposited in a thickness of about 200 nm to form the cathode.

Into the organic EL devices fabricated in the manner described above, holes and electrons are injected by applying a low direct voltage of 20 to 30 V or less setting the transparent electrode side as the anode, so that light is emitted as a result of their recombination to obtain a luminance of about 1,000 cd/m$^2$.

As other forms of the organic EL devices as described above, proposed are double heterojunction type devices of a triple-layer structure provided with an electron injecting and transporting layer (hereinafter abbreviated "EITL") between an OEL and a cathode, or HITL emitting type electroluminescent devices of a double-layer structure comprised of a hole injecting, transporting and emitting layer and an EITL [Applied Physics Lett., 57(6),531(1990)]. The devices of the triple-layer structure are comprised of an ITO electrode and successively deposited thereon an HITL comprising TPD, an OEL comprising 1-[4-N,N-bis(p-methoxyphenyl) aminostyryl] naphthalene (hereinafter "NSD"), an EITL comprising 2-(4-biphenylyl)-5-(4-t-butylphenyl)-1,3,4-oxadiazole (hereinafter "BPBD"), and a cathode comprising an Mg-Ag alloy. HITL emitting type electroluminescent devices of the double-layer structure have a structure in which the TPD layer is removed from the devices of the above triple-layer structure and the NSD layer serves as both the HITL and the OEL.

As still other forms of organic EL devices, devices of a single-layer structure that can be produced at a low cost are proposed [Applied Physics, Vol. 61, No. 10, page 1044 (1992)]. Devices of this type are comprised of an ITO anode and successively coated thereon a film formed in a thickness of about 100 nm by spin coating or the like of a hole transporting poly(N-vinylcarbazole) solution comprising a mixture of about 1% by weight of coumarin-6 as a electroluminescent material and 20 to 60% by weight of BPBD as an electron transporting material, and then a cathode comprising an Mg-Ag alloy.

Into the organic EL devices fabricated in the manner described above, holes and electrons are injected by applying a low direct voltage of 20 to 30 V or less setting the transparent electrode side as the anode, so that light is emitted as a result of their recombination to obtain a luminance of about 1,000 cd/m$^2$.

As described above, in the organic EL devices, various methods of layer construction are proposed in order to make organic phosphors emit light, but they are common one another on the point that holes are efficiently injected from the anode into the OEL containing an organic phosphor and electrons are injected from the cathode to make the phosphor emit light. In principle, it can be expected that, with the construction in the order of an anode, an electron-blockable HITL, an OEL, a hole-blockable EITL and a cathode, the carrier confinement effect is utilized to increase the density of electrons and holes in the OEL to thereby increase the rate of recombination, so that an EL device with a high electroluminescent efficiency can be obtained.

However, at present, no well effective electron-blocking, hole injecting and transporting material has been obtained. Accordingly, we consider that the most important goal toward the practical utilization of organic EL devices is to improve durability of the electron-blockable HITL and the cathode.

Incidentally, preferable requirements for cathode materials used in organic EL devices can be said to be as follows:

(1) They have a good adhesion to organic thin films.
(2) They do not tend to be oxidized and are stable.
(3) They have a low work function so that electrons can be readily injected at an energy level of the lowest unoccupied molecular orbital (hereinafter "LUMO") of organic thin-film materials.

The cathode material Mg-Ag alloy (atomic ratio: 10:1; work function: about 3.8 eV) hitherto most used is a material in which Ag is added to improve the poor adhesion to organic thin films that is attributable to Mg having a low work function (work function: about 3.6 eV). However, this material has the problem that it will more likely corrode metal films up to their insides in the moist air than an Mg single material because of formation of a local cell due to the addition of Ag.

The organic EL devices have been also involved in the problem that no satisfactory method of sealing has been hitherto developed because of their weakness to heat at the time of heat sealing or to adhesives containing an organic solvent. Hence, the devices are stored or driven in vacuum or in an inert atmosphere such as dry Ar gas, and it has been sought to develop cathode materials having a low work function and a stability and to develop sealing techniques for achieving stable drive in the air.

The energy level of LUMO (lowest unoccupied molecular orbital) of Alq$_3$ hitherto known as a typical electron transporting electroluminescent material capable of obtaining the highest luminance is about 3.1 eV as a value determined by subtracting an optical energy gap (2.75 eV) from a value of the work function measured in the atmosphere by the photoemission method using a surface analyzer AC-1, manufactured by Riken Keiki K.K. The energy level is about 2.7 eV in the case of the BPBD used as an EITL. Now, as cathode materials for efficiently injecting electrons into these materials to obtain an organic EL device having a high luminance of 10,000 cd/m$^2$ or more, expectations can be placed on alkali metals such as Li (work function: 2.9 eV), Na (ditto: 2.75 eV) and K (ditto: 2.15 eV), having a work function smaller than 3.1 eV and a high Fermi level. There, however, is the problem that they are extremely likely to be oxidized and are unstable and hence can not be used as cathode materials.

Another conventional hole injecting and transporting material CuPc is heat-resistant and highly durable and has a high efficiency for the hole injection from ITO. It, however, has a low energy level of LUMO and hence has a low electron blocking performance at the interface of the electroluminescent layer. It has also a large absorption in the wavelength region of visible rays, and also is crystalline to make deposited film surfaces uneven. Hence, devices in which only the CuPc is used as an organic hole injecting and transporting material have had the problem that their efficiency for withdrawing electroluminescence is low and an electrical short of the device tend to occur.

Moreover, although the compounds represented by the formulas (1) to (3) have a higher energy level of LUMO than ordinary electroluminescent materials to have a high electron blocking performance at the interface of the electroluminescent layer, are amorphous to enable formation of deposited films with smooth surfaces and have no absorption at the visible wavelength region, they have had the problem that they have a low glass transition temperature and hence may be mixed with the OEL as a result of heat generation during the fabrication process of devices or the driving of devices, or the films may become crystalline with the lapse of time to make their surfaces uneven. For example, when a TPD [formula (3)] layer and an $Alq_3$ layer are successively deposited on a glass substrate in the form of thin films of 50 nm thick each, there is the problem that both the layers become mixed at a temperature of about 95° C.

Another HITL is proposed in which the CuPc and any of the compounds represented by the formulas (1) to (3) are deposited in bilayer to reduce the thickness of the CuPc layer to half so that it can be endowed with abilities of electroluminescent light transmission, hole injection and electron blocking to a certain extent. This, however, has an insufficient heat resistance.

There are additional problems that an HITL comprised of only low-molecular weight compounds has a low mechanical strength of the film and a device having an organic layer formed by only deposition of low-molecular weight compounds tends to cause a short at the edge portion, the part having a thin step coverage, of an ITO etching pattern.

In relation thereto, according to Television Society Technical Report, Vol. 16, No. 2, page 47 (1992), a TPD single layer deposited film is used as the HITL and an $Alq_3$ deposited film to which quinacridone (hereinafter "Qd") has been added is used as the electroluminescent layer to achieve a maximum luminance of 68,000 $cd/m^2$ (right before melt fracture). This device had an initial luminance of as low as 275 $cd/m^2$ in its drive at a constant current of 4 $mA/cm^2$ and had a luminance half-life of 130 hours. In general, organic EL devices have the problem that increasing luminance by increasing current density results in an increase in the speed at which the electrical resistance of the device rises and in an acceleration of the rate of deterioration, and hence it has been difficult to obtain devices having achieved both the high luminance and the long lifetime.

SUMMARY OF THE INVENTION

A first object of the present invention is to provide a high-luminance organic EL device making use of a cathode material that has a lower work function than the Mg-Ag alloy conventionally used and yet is relatively stable, and having a high luminance.

A second object of the present invention is to provide, in addition to the first object, to provide a high-luminance and long-lifetime organic EL device that has solved the problem that the devices themselves tend to deteriorate because the organic materials having been used in conventional organic EL devices commonly have unsatisfactory heat resistance and film strength and tend to become crystalline, and the problem that the HITLs formed by sole use of CuPc or Qd having an excellent heat resistance are lacking in light transmittance.

Other objects will become apparent from the description in the present specification.

To achieve the first object stated above, the present invention provides an organic EL device comprising a substrate and formed thereon a multilayered structure successively comprised of at least an anode layer, an OEL and a cathode layer, wherein a sealing layer comprised of at least one selected from the group consisting of a metal oxide, a metal fluoride and a metal sulfide is further provided on, of both the electrode layers, one electrode layer formed later.

To achieve the second object stated above, the present invention provides, in the organic EL device described above, an organic EL device further comprising an HITL provided between the anode layer and the OEL, wherein at least the HITL comprises a polyphosphazene compound having a hole transporting residual group or the OEL comprises a polyphosphazene compound having an electroluminescent residual group, or the organic EL device, wherein at least the HITL or the OEL comprises a polyether compound or polyphosphate compound having an aromatic tertiary amine residual group in its main chain.

DESCRIPTION OF THE PREFERRED EMBODIMENTS

Figure 1:
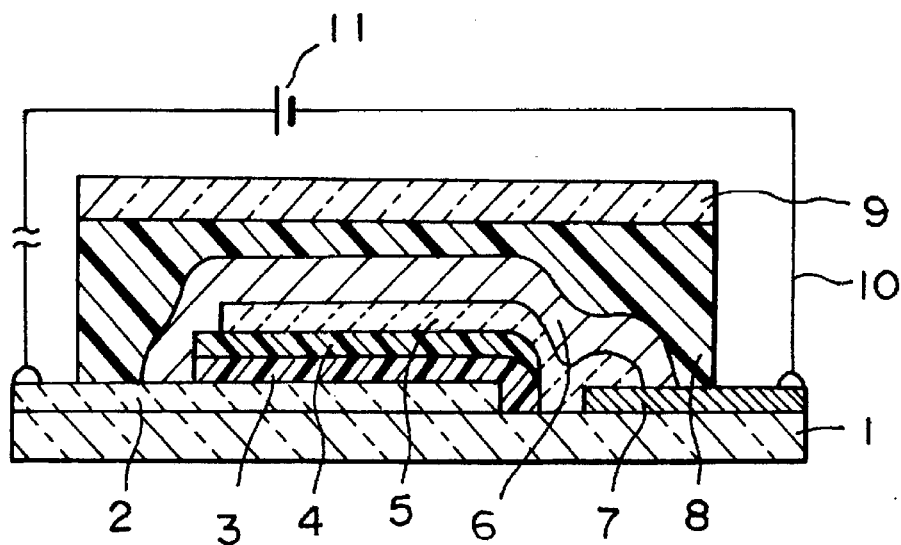
FIGS. 1 to 10 are cross-sectional illustrations of the organic EL devices according to the present invention.

The organic EL device of the present invention will be described in detail with reference to the accompanying drawings. In the drawings, the same reference numerals denote the same or equivalent constituents.

FIG. 1 is a cross-sectional illustration of a preferred embodiment of the organic EL device according to the present invention. As shown in FIG. 1, this organic EL device comprises a substrate 1 and successively formed thereon an anode 2, an HITL 3, an OEL 4 and a cathode 5, and also a sealing layer 6 formed in such a way that at least the HITL 3, the OEL 4 and the cathode 5 are covered with it. Here, the cathode 5 comes into contact with a cathode-withdrawing conductive layer 7 so as to electrically communicate therewith. The HITL 3, the OEL 4, the cathode 5 and the sealing layer 6 are sealed as a whole by an adhesive layer 8 and at the same time covered with a surface protective member 9. The anode 2 and the cathode 5 are connected with each other through a lead 10 via a power source. The adhesive layer 8 may be provided around only the surface protective member 9 and the whole device may be sealed in a dehumidified inert gas.

Figure 2:
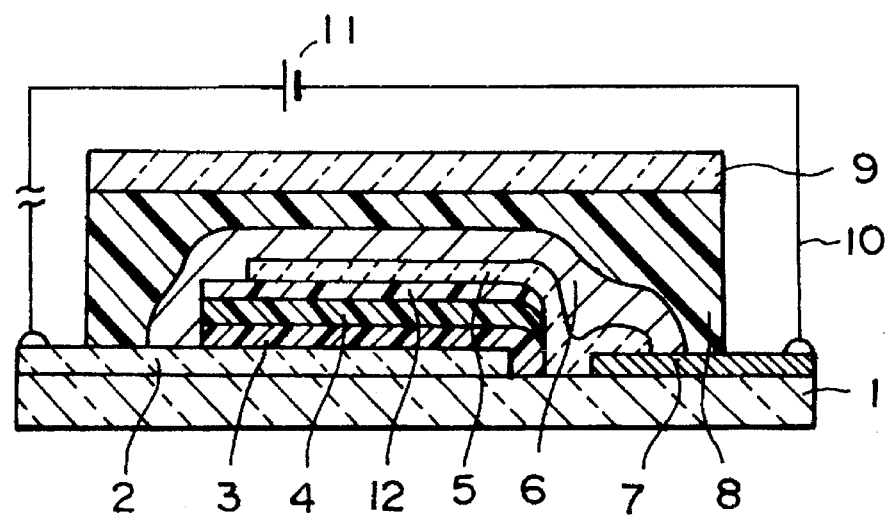

As shown in FIG. 2, en EITL 12 may also be provided between the OEL 4 and the cathode 5 so that the efficiency for electron injection from the cathode 5 into the OEL 4 can be increased and also the flow of holes into the cathode can be blocked.

Figure 3:
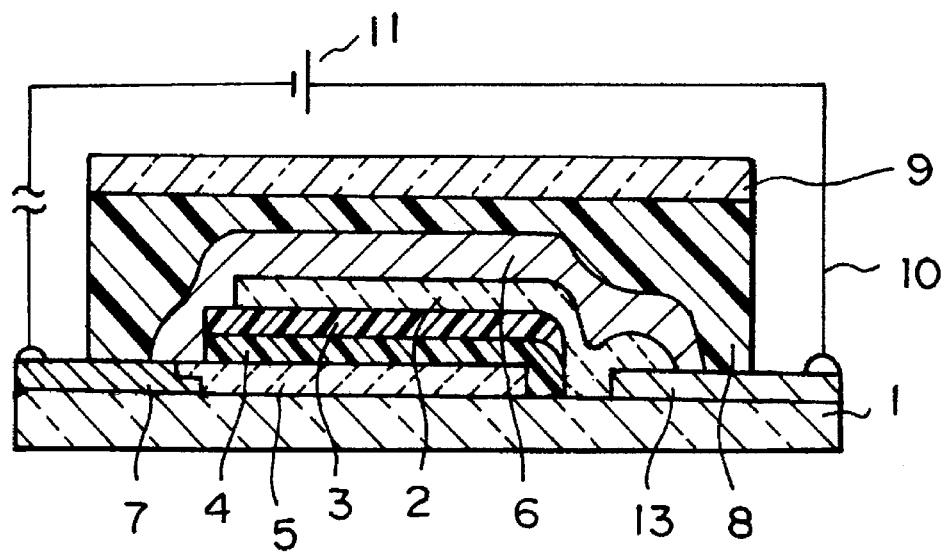
Figure 4:
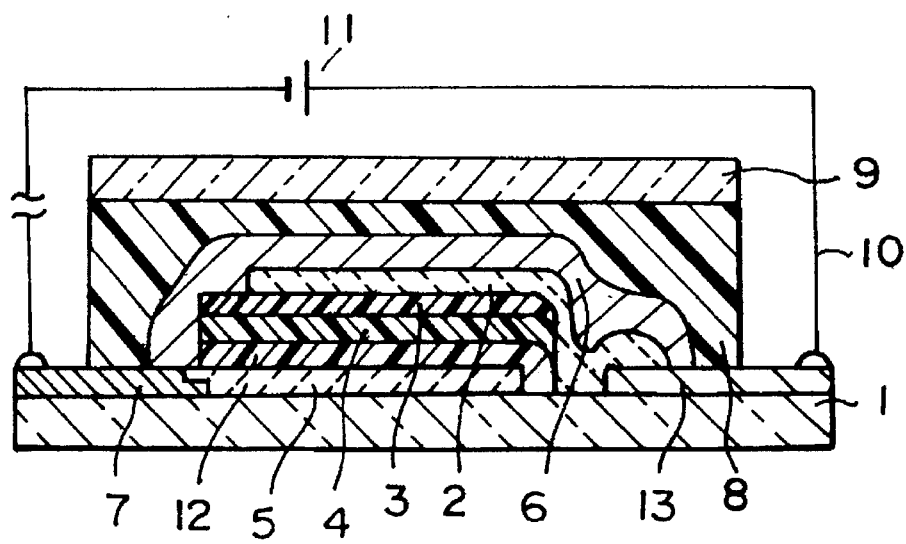

The embodiment shown in FIG. 1 is an example in which the anode layer 2 and the following layers are formed in order on the substrate 1. Alternatively, as shown in FIG. 3, the cathode 5, the OEL 4, the HITL 3, the anode 2 and the sealing layer 6 may be formed in this order from the substrate 1. In the latter case, the anode 2 comes into contact with an anode-withdrawing conductive layer 13. As shown in FIG. 4, the EITL 12 may also be provided between the cathode 5 and the OEL 4.

In the present invention, as the substrate 1, insulating and light-transmitting materials as exemplified by glass sheets and plastic sheets can be preferably used.

Figure 5:
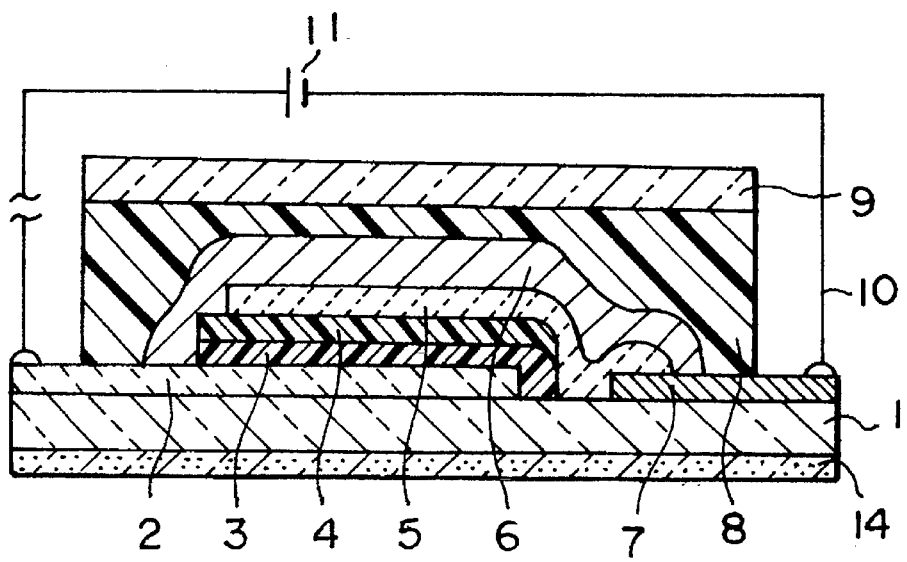
Figure 6:
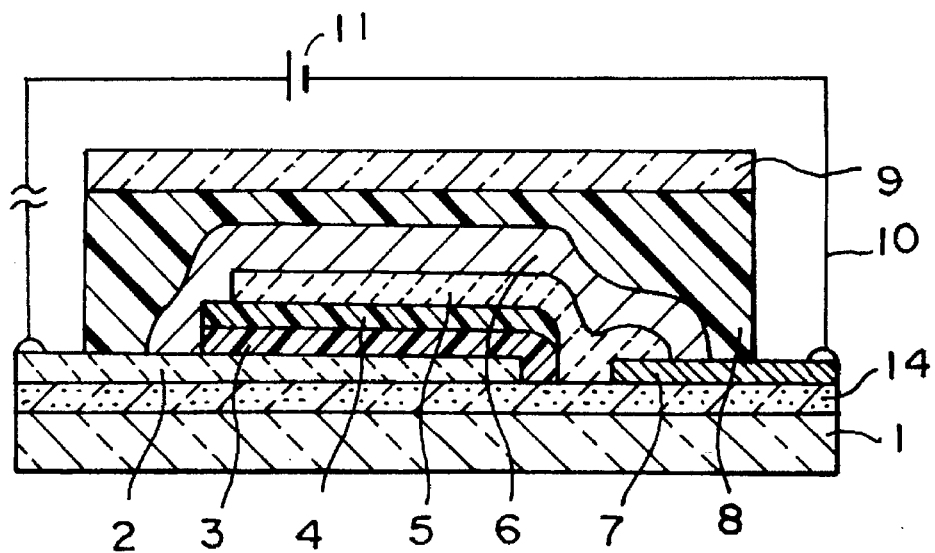

In the case when a usual soda-lime glass substrate is used as the substrate, there is a problem that the organic EL device may undergo deterioration due to ultraviolet rays since the soda-lime glass substrate transmits ultraviolet rays with a wavelength of 300 nm or more. In order to prevent such deterioration, an ultraviolet screening layer 14 may preferably be formed, as shown in FIG. 5, on the surface of the substrate 1 on its side opposite to the anode 2 side, or, as shown in FIG. 6, on the surface of the substrate 1 on its anode 2 side.

Such an ultraviolet screening layer 14 may preferably be formed of a metal oxide capable of screening the light with a wavelength shorter than 380 nm and transmitting the EL light in a visible region of 400 nm or more. Such an oxide can be exemplified by single metal oxides such as zinc oxide, cerium oxide, iron oxide, chromium oxide and nickel oxide; compound metal oxides composed of at least one metal selected from aluminum, iron, chromium, cerium, zirconium and titanium, and zinc; compound metal oxides composed of aluminum and calcium; and compound metal oxides composed of aluminum, calcium and zinc; compound metal oxides composed of strontium and titanium; and compound metal oxides composed of strontium, titanium and zinc.

The ultraviolet screening layer 14 can be formed by coating the substrate with a resin in which the above metal oxide has been dispersed. Preferably the layer may be formed by vacuum deposition, sputtering or the like of the metal oxide in a thickness of 0.1 μm or more, and preferably from 0.5 to 1 μm.

Materials for the anode 2 can be preferably selected from the following materials, which are conventionally used in organic EL devices, i.e., a transparent electrode comprising a transparent conductive material such as ITO (work function: 4.6 to 4.8 eV) or zinc-aluminum oxide formed on the substrate by vacuum deposition or sputtering so as to have a surface resistivity of 10 to 50 Ω/square and a visible light transmittance of 80% or more; a semitransparent electrode comprising gold or platinum very thinly deposited so as to be semitransparent; and a semitransparent electrode formed by coating a polymer such as polyaniline, polypyrrole or polythiophene.

If the anode 2 is comprised of opaque materials, for example, metal materials such as gold, platinum, palladium and nickel, having a high value of work function and capable of readily injecting holes into the OEL 4 through the HTL 3, and semiconductor materials such as silicon, gallium phosphide and amorphous silicon carbide, having a value of work function of 4.6 or more, the cathode can be comprised of a semitransparent metal electrode with a low work function. In the case when the cathode 5 is also opaque, at least one end of the OEL 4 must be transparent.

The HTL 3 is a layer that smoothly transport holes from the anode to the OEL 4 and at the same time a layer that prevents electrons from moving from the OEL 4 to the anode side. Such an HTL 3 may preferably be formed of a material that satisfies the following requirements: to have an ionization energy (work function) intermediate between those of the material of the anode 2 and the material of the OEL 4, to have good film forming properties, to be substantially transparent in the visible wavelength region of the material of the OEL 4 and also to have a higher energy level of LUMO than that of the adjoining OEL material. For example, although the following compounds can be used in the form of a single layer or multilayer like the conventional cases, i.e., phthalocyanines such as copper phthalocyanine and metal-free phthalocyanine, and tetraphenyldiamine analogs such as compounds represented by the formulas (1) to (3) and N,N'-diphenyl-N,N'-bis(p-tolyl)-1,1'-biphenyl-4,4'-diamine, it is preferred to use a high-molecular weight polyphosphazene compound that is usually capable of being synthesized by substituting chlorine atoms in polydichlorophosphazene by hole transporting groups ($R^1$ and $R^2$) of formula (4) in a high substitution percentage of more than 50%, or a polyether compound or poly phosphate compound having in its main chain an aromatic tertiary amine residual group of formula (7).

wherein n is an integer representing a degree of polymerization, $R^1$ and $R^2$ are each independently selected from groups containing an aromatic tertiary amine of formula (5) or (6), and part of $R^1$ and $R^2$ may be substituted with a phenoxy group, a naphthoxy group, an anthroxy group, an alkoxy group, a hydroxyl group, a chlorine atom, or a cross-linkable group having an SH group or a double bond or triple bond.

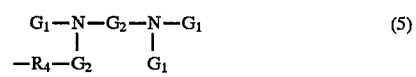

or

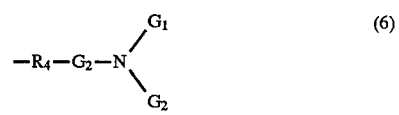

In the formulas (5) and (6), $G_1$ and $G_2$ are each independently selected from groups shown below. $R_3$ in the following is each independently selected from a hydrogen atom, a methyl group, a trifluoromethyl group, a hydroxyl group, a methoxy group and a fluorine atom, m is a positive integer that represents the number of the substituent. $R_4$ is independently selected from groups shown below, in which $R_5$ is a hydrogen atom or an alkyl chain having 1 to 4 carbon atoms.

$G_1$:

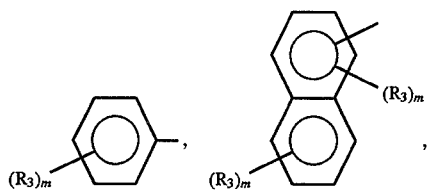

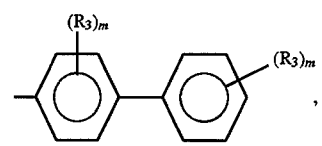

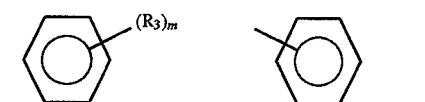

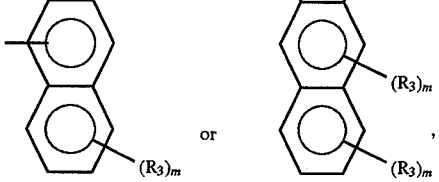

$G_2$:

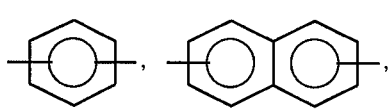

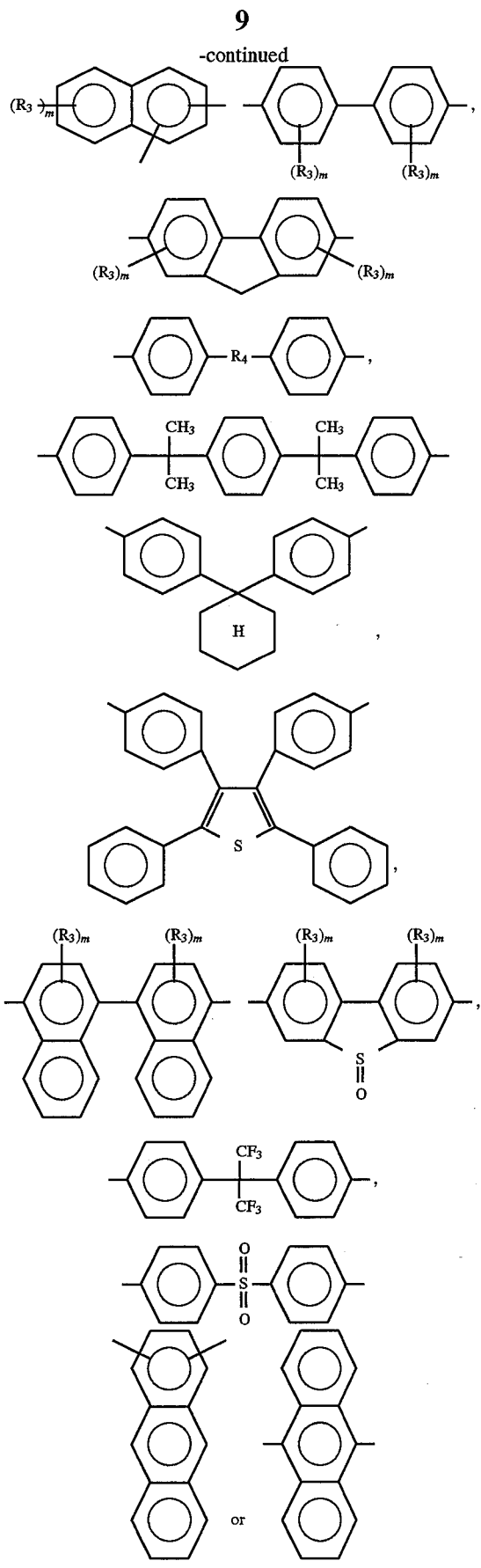

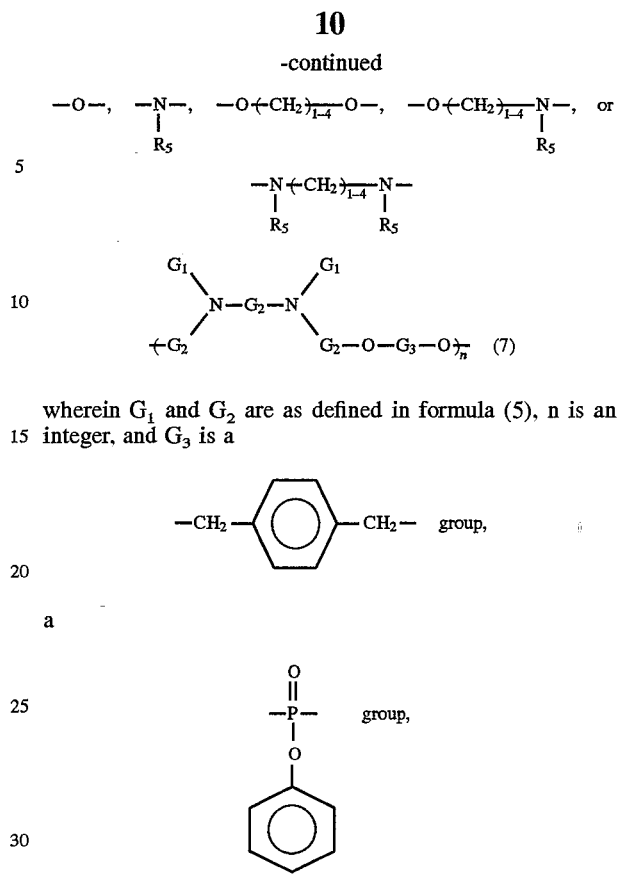

wherein $G_1$ and $G_2$ are as defined in formula (5), n is an integer, and $G_3$ is a $$-CH_2-\underset{}{\bigcirc}-CH_2- \text{ group,}$$

a $$-\underset{\underset{O}{|}}{\overset{\overset{O}{\|}}{P}}- \text{ group,}$$
(with phenyl)

an alkylene group, or a linking group to which a cross-linkable group having an SH group or a double bond or triple bond has been bonded.

The HITL 3 can be formed by known methods. For example, the above compound may be deposited on the anode 2, or formed thereon by spin-coating a composition comprising the compound dispersed in a resin such as polyester, polycarbonate or polymethylphenylsilane. In particular, most compounds of the formulas (4) and (7) can be dissolved in usual organic solvents such as toluene, tetrahydrofuran, chloroform, dioxane, dimethylacetamide, dimethylformamide and cyclohexane. Hence, the layer can be simply formed by coating such a solution on the anode 2 by a coating process such as spin coating, dip coating or roll coating. In this case, in order to improve its adhesion to the anode 2 formed of ITO or the like, the surface of the anode 2 may be previously treated with a coupling agent of a silane type or titanate type.

Figure 7:
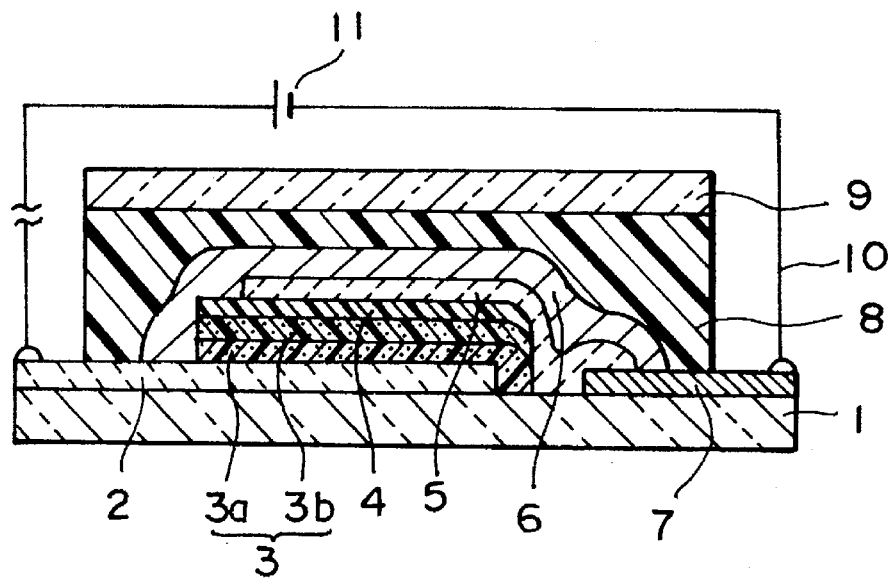
Figure 8:
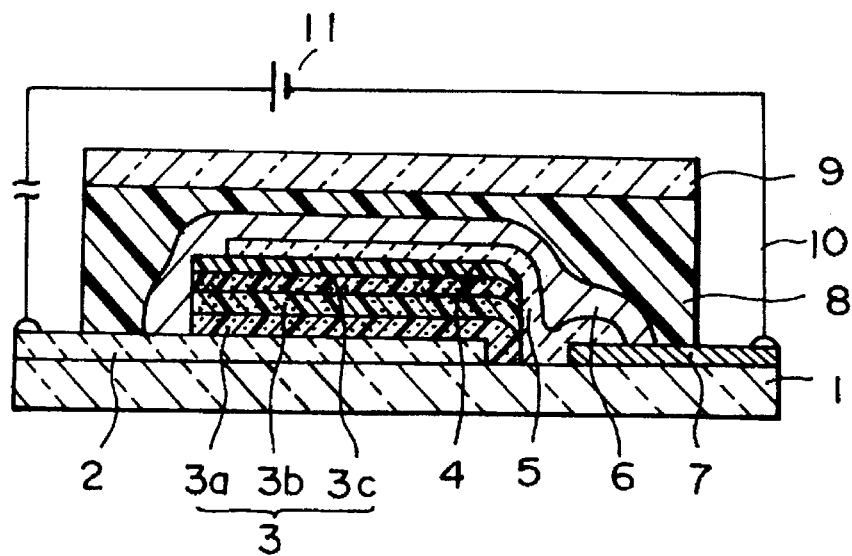

In order to improve the stability of the organic EL device or in order to improve the efficiency of hole injection into the OEL 4 to enable achievement of bright electroluminescent emission at a low voltage, the HITL 3 may preferably be comprised of a plurality of layers as shown in FIGS. 7 and 8. FIG. 7 shows an example in which the HITL 3 is comprised of two layers, a first HITL 3a and a second HITL 3b. FIG. 8 shows an example in which it is comprised of three layers, that is, further provided with a third HITL 3c.

In these cases, the plurality of hole injecting and transporting unit layers may preferably have work function values that are different from each other and also intermediate between the values of the work function of the anode 2 and the OEL 4. Namely, the respective values of the work function may preferably be selected so that the energy gap between a work function of the anode 2 and that of the OEL 4 becomes small. In this case, the values of work function need not be stepwise changed, and may have an irregularity, between the anode 2 and the OEL 4 so long as the difference in the work function between the layers adjoining to each other between the anode and the OEL is within the range of 0.2 eV or less. However, the energy level of LUMO of the HTTL coming into contact with the OEL may preferably be higher than the energy level of LUMO of the OEL. The multiple structure taken in this way enables achievement of stable electroluminescence over a long period of time.

In the case when the HTTL 3 is comprised of a plurality of unit layers, the compound of formula (4) or the compound of formula (7), described above, may preferably be used in at least one unit layer. In such an instance, for the purposes of making small the difference in height of the steps of work function between the anode 2 and the OEL 4 to improve hole injection efficiency, improving adhesion between layers, preventing deterioration of the performance of the organic EL device and controlling color tones of electroluminescence, at least one unit layer formed of any of the materials disclosed or referred to in Japanese Patent Application Laid-open No. 4-52009, No. 4-114692, No. 4-142791 and No. 4-230995, the hole transporting polymeric materials disclosed in U.S. Pat. No. 3,265,496, No.4, 025,341, No. 3,853,311 and No. 3,873,312 and European Patents No. 295,115, No. 295,125 and No. 295,125, phthalocyanine compound materials such as CuPc and metal-free phthalocyanine, heat-resistant low-molecular weight hole injecting and transporting materials such as Qd or low-molecular weight aromatic tertiary amine type hole transporting materials of formula (8);

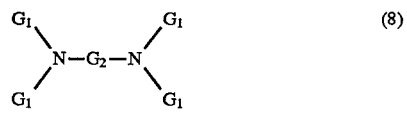

wherein $G_1$ and $G_2$ are as defined in formula (5) or inorganic compound materials such as Si, SiC or Se may be provided on the unit layer comprising the compound of formula (4) or the compound of formula (7).

Examples of the substituents $R^1$ and $R^2$ of the polyphosphazene compound of formula (4) are shown in Table 1 together with their glass transition temperatures (Tg, °C.), values of work function (eV), values of energy level of lowest unoccupied molecular orbitals (LUMO) (eV), and their substitution percentage.

TABLE 1

Structures and physical properties of polyphosphazene

| Abbr. | Structures of $R^1, R^2$ | Tg (°C.) | W.F. (eV) | LUMO (eV) | Substitution percentage (%) |
|---|---|---|---|---|---|
| P1 | (triphenylamine with O—) | 83 | 5.8 | 2.3 | 74.5 |
| P2 | (triphenylamine with OCH₂CH₂—O—) | 66 | 5.8 | 2.3 | no meas. |
| P3 | (triphenylamine with OCH₂CH₂—O—) 81%; F₂CCH₂O— 19% | 42 | 5.9 | 2.4 | no meas. |

TABLE 1-continued

Structures and physical properties of polyphosphazene

| Abbr. | Structures of R¹,R² | Tg (°C.) | W.F. (eV) | LUMO (eV) | Substitution percentage (%) |
|---|---|---|---|---|---|
| P4 | 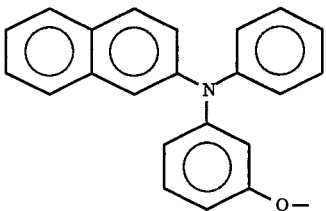 | 119 | 5.7 | 2.6 | 62.6 |
| P5 | 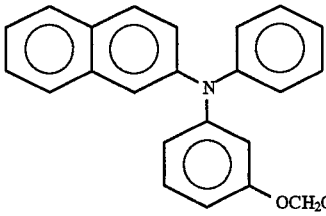 | 82 | 5.8 | 2.7 | no meas. |
| P6 | 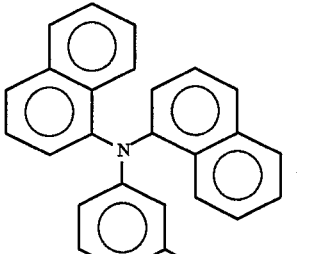 | 168 | 5.7 | 2.7 | 52.2 |
| P7 | 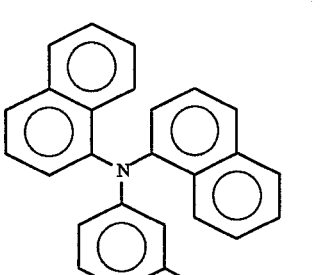 | 142 | 5.7 | 2.7 | no meas. |
| P8 | 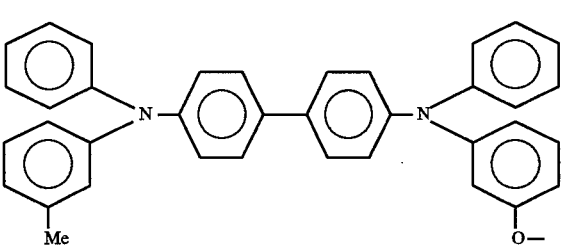 | 132 | 5.5 | 2.4 | 70.7 |

In Table 1, Tg is measured using a differential scanning carolimeter (DSC200, manufactured by Seiko Denshi Kogyo Co.) in a nitrogen atmosphere at a rate of temperature rise of 20° C./min. The work function is a value measured using a surface analyzer AC-1 (manufactured by Riken Keiki Co.) in the atmosphere. The energy level of lowest unoccupied molecular orbits (LUMO) is determined by measuring ultraviolet-visible absorption spectra of the respective materials and subtracting the absorption edge energy from the work function. Their substitution percentage is determined by elemental analysis.

Next, examples of the polyether compound and polyphosphate compound of formula (7) are shown in Table 2 together with their glass transition temperatures (Tg,°C.), values of work function (eV) and values of energy level of LUMO (eV). The respective values of the CuPc and TPD that can be used as the unit layer of the HITL are also shown in Table 2 for reference.

Polymers of P1 to P10 are colorless and transparent in the visible wavelength region.

TABLE 2

Structures and physical properties of polyether, polyphosphate and EL device-related compounds

| Abbr. | Structures or chemical name | Tg (°C.) | W.F. (eV) | LUMO (eV) |
|---|---|---|---|---|
| P9 | [structure: —O—C₆H₄—N(C₆H₅)—C₆H₄—C₆H₄—N(C₆H₅)—C₆H₄—O—CH₂—C₆H₄—CH₂—]ₙ | 133 | 5.6 | 2.4 |
| P10 | [structure: —O—C₆H₄—N(C₆H₅)—C₆H₄—C₆H₄—N(C₆H₅)—C₆H₄—O—P(=O)(OC₆H₅)—]ₙ | 106 | 5.5 | 2.3 |
| CuPc | Copper phthalocyanine | | 5.4 | 3.8 |
| TPD | N,N'-diphenyl-N,N'-bis(3-methylphenyl)-1,1'-biphenyl-4,4'-diamine | 67 | 5.4 | 2.3 |

Incidentally, in order to improve heat resistance of organic EL devices over that of devices making use of the conventional TPD as a hole injecting and transporting material, it is desirable to use a hole injecting and transporting material having a higher Tg than that of the TPD, where such a higher Tg results in a lower tendency for the material to become crystalline.

However, for the purpose of improving adhesion between layers, even a material having a low Tg as exemplified by P3 can be provided in a thickness of several nm or less between layers formed of high-Tg materials.

The materials of P8 to P10 are polymers having a unit containing a TPD structure, and having a heat resistance higher than that of TPD. They, however, have had the problem that their work function becomes a little larger than the TPD. Then, in order to prevent the efficiency of hole injection from ITO from being lowered, a material such as CuPc, having a work function intermediate between the anode and the polymer hole transporting layer material, having a high heat resistance and being stable also to hole injection, may be inserted between the anode and the polymer hole transporting layer as a first HITL in a thickness of about 1 to 30 nm, preferably a thickness of 15 nm or less, that well allows transmission of electroluminescence. This is effective for making the HITL heat-resistant and besides decreasing the drive voltage of the organic EL device.

It is also very effective for making the device stable during its drive, to insert a third HITL having a low reactivity with the organic electroluminescent material and a satisfactory electron blocking ability suitable for the electroluminescent material, between the polymer hole transporting layer used as a second HITL and the electroluminescent layer.

Although the low-molecular weight hole injecting and transporting materials such as TPD are effective as the third HITL for electroluminescent layers comprising Alq₃ commonly used, in order not to cause a lowering of the heat resistance of the electroluminescent device, the third HITL is deposited in a thickness of 30 nm or less, and preferably in a thickness of about 5 nm.

In this way, in the HITL comprised of three layers according to the present invention, a layer containing the polymer having a higher Tg than the TPD of the present invention may be provided as a second HITL in a thickness of from about 10 nm to about 100 nm, so that it becomes possible to obtain an HITL having higher transmittance, smoothness and film strength than an HITL with the same thickness comprised of only the CuPc or Qd that is heat-resistant but is crystalline and has a large absorbance, and having a higher heat resistance, having a lower tendency to become crystalline and having a higher film strength than the HITL with the same thickness comprised of only TPD. It becomes also possible to slow the rate of increase in device resistance during the drive of the device compared with the organic EL device having the HITL of a single-layer or double-layer structure, so that the device can be made to have a long lifetime.

A solution prepared by mixing the hole transporting polyphosphazene compound described above and other suitable electroluminescent material and electron transporting material in a suitable proportion may be coated on the anode made of ITO or the like to form the hole transporting and electron transporting organic electroluminescent layer, whereby a single-layer type organic EL device can also be produced.

Figure 9:
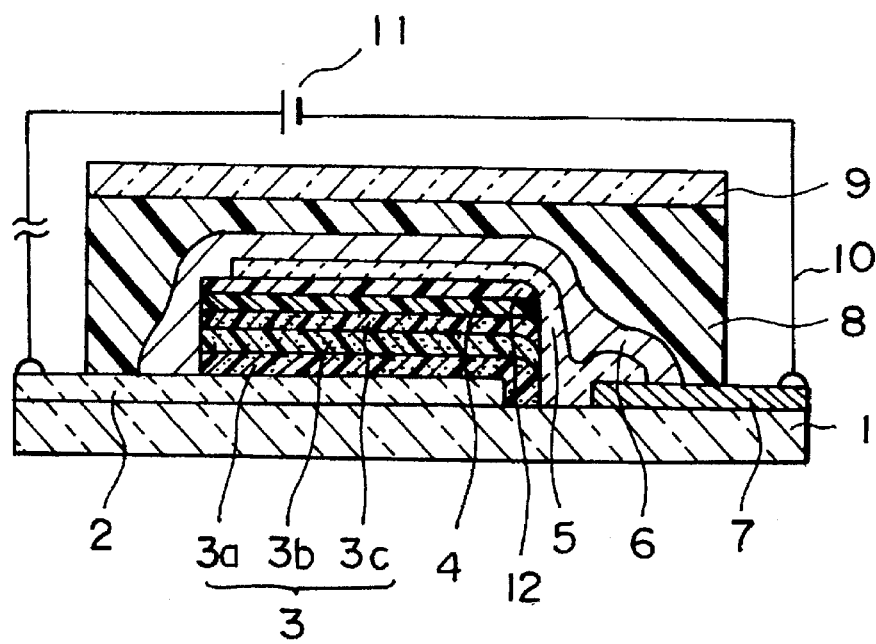

In the case of also an embodiment of the organic EL device as shown in FIG. 8, an EITL 12 may be provided between the OEL 4 and the cathode 5 as shown in FIG. 9.

The OEL 4 is a layer that causes holes and electrons to recombine in that layer to cause electroluminescence. Such an OEL 4 may be formed of a fluorescent material capable of emitting fluorescence in the visible region and capable of being formed into films. Such a fluorescent material can be exemplified by anthracene, salicylates, pyrene, coronene, perylene, tetraphenylbutadiene, 9,10-bis(phenylethynyl) anthracene, 8-quinolinol lithium, Alq₃, tris(8-quinolinol) aluminum, tris(5,7-dichloro-8-quinolinol)aluminum, tris(5-chloro-8-quinolinol)aluminum, bis(8-quinolinol)zinc, tris (5-fluoro-8-qulnolinol)aluminum, tris(8-quinolinol) scandium, bis[8-(p-tosyl)aminoquinoline]zinc complex or cadmium complex, 1,2,3,4-tetraphenylbutadiene, pentaphenylcyclobutadiene, poly(2,5-diheptyloxy-p-phenylenevinylene), or fluorescent materials disclosed in Japanese Patent Application Laid-open No. 4-31488 and U.S. Pat. No. 5,141,671, No. 4,769,292 and No. 5,151,629. A polyphosphazene compound having a electroluminescent group may more preferably be used as the fluorescent material.

Such a polyphosphazene compound can be exemplified by polyphosphazene compounds having a structure of fluorescent coloring matter as an electroluminescent group, which can be obtained by reacting polydichlorophosphazene with a fluorescent coloring matter having at least one hydroxyl group or unsubstituted or monosubstituted amino group.

Such a fluorescent coloring matter can be exemplified by Solvent Yellow 116 and 3-(2'-benzothiazolyl)-7-hydroxycoumarin.

As the fluorescent material for the OEL 4, the polyphosphazene compound of formula (4) described in regard to the HTTL 3 can be used in some instances.

The OEL 4 can be formed on the HTTL 3 by a known process such as vacuum deposition, build-up film formation, or spin coating making use of a resin binder, which may be selected according to the type of the fluorescent material to be used. In particular, most polyphosphazene compounds can be dissolved in usual organic solvents such as toluene, tetrahydrofuran, chloroform, dioxane, dimethylacetamide, dimethylformamide and cyclohexane. Hence, the layer can be simply formed by coating such a solution on the HTTL 3 by a coating process such as spin coating, dip coating or roll coating. It may be formed in a thickness of 1 μm or less, and preferably from 1 to 100 nm.

In order to convert electroluminescent wavelengths or improving electroluminescent efficiency, the OEL 4 may be doped with at least one fluorescent material selected from coumarin or pyran type coloring matters and quinacridone or perylene type fluorescent pigments disclosed in laser dye catalogues published by U.S. Lambda PHYSIK and Eastman Kodak Co. The OEL 4 may also be comprised of a multilayer of two or more layers comprising layers formed of different fluorescent materials. In this case, part of the layers may exhibit fluorescence in the infrared region or ultraviolet region.

For reference, a typical fluorescent material Alq3 and doping dyes for improving electroluminescent efficiency, coumarin-6 (C6) and Qd, are shown in Table 3 together with their values of work function (eV) and values of energy level of LUMO (eV).

TABLE 3

Energy level of fluorescent materials

| Abbr. | Chemical name | W.F. (eV) | LUMO (eV) |
|---|---|---|---|
| Alq$_3$ | Tris(8-quinoline)aluminum | 5.8 | 3.2 |
| C6 | 3-(2'-Benzothiazolyl)-7-diethylaminocoumarin | 5.6 | 3.3 |
| Qd | Quinacridone | 5.8 | 3.5 |

The EITL 12 is a layer that enables electrons to be efficiently transported from the cathode 5 to the OEL 4, and may preferably be formed of a material having a large electron mobility, having an energy level of LUMO intermediate between the energy level of LUMO of the OEL 4 and the Fermi level (work function) of the cathode 5, having a larger work function than that of the OEL 4 and also having excellent film forming properties. Such a material can be exemplified by BPBD, 2,5-bis(1-naphthy1)-1,3,4-oxadiazole, or oxadiazoles disclosed in Japan Chemical Society, page 1540 (1991).

As the material for the EITL 12, the polyphosphazene compound of formula (4) described in regard to the HTTL 3 can be used in some instances. In particular, a polyphosphazene compound wherein, in formula (4), the electron transporting groups ($R^1$ and $R^2$) are substituents of formula (9) can be preferably used.

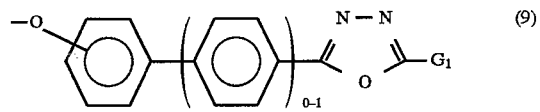

In the formula, $G_1$ is as defined in formula (5).

The EITL 12 can be formed on the OEL 4 by a known process such as vacuum deposition, build-up film formation, or spin coating making use of a resin binder, which may be selected according to the type of the EITL material to be used. In particular, most polyphosphazene compounds can be dissolved in usual organic solvents such as toluene, tetrahydrofuran, chloroform, dioxane, dimethylacetamide, dimethylformamide and cyclohexane. Hence, the layer can be simply formed by coating such a solution on the OEL 4 by a coating process such as spin coating, dip coating or roll coating. It may be formed in a thickness of from 1 to 100 nm. In this case, a solvent that does not attack the OEL and so forth must be used.

In order to improve heat resistance of the HTTL 3, OEL 4 or EITL 12 described above and also in order to prevent layers having been formed from being dissolved and mutually mixed when solvents are used in spin coating or the like in the subsequent step, a polymerizable or cross-linkable functional group such as a vinyl group, an allyl group, a methacryloyloxy group, a methacryloyloxymethyl group, a methacryloyloxyethyl group, an acryloyl group, an acryloyloxymethyl group, an acryloyloxyethyl group, a cinnamoyl group, a styrene methyloxy group, a propioloyl group or a propargyl group may be introduced into each component material molecule, which is then formed into a film, and thereafter heat, light, radiations or the like may be caused to act on the film to carry out polymerization or cross-linking. In order to improve film forming properties of each layer, an alkyl group may also be introduced into each component material molecule.

The cathode 5 may preferably be formed of a material having a lower work function than the energy level of LUMO of the OEL 4 or EITL 12. Such a material may include single metals such as Li, Na, K, Mg, La, Ce, Ca, St, Al, Ag, In, Sn, Zn and Zr or alloys of two or more of these, which can be used in the form of a single layer or a multilayer. Of these, it is preferred to use alkali metals having a very low work function. Since, however, single alkali metals are very lacking in stability, it is more preferred to use those formed into alloys thereof with stable Mg, Al, In, Sn, Zn, Ag, Zr or the like. For example, single Mg has a work function of about 3.6 eV, but Mg formed into an alloy with an alkali metal such as Li has a work function lowered to 3.1 to 3.2 eV.

Such use of the alloy of an alkali metal as the cathode material makes it possible to prevent the cathode from being rapidly oxidized or corroded up to the inside of the cathode coming into contact with the OEL 4 or EITL 12 when the cathode is exposed to the atmosphere from a vacuum environment after the cathode has been formed by codeposition or the like.

In such an alloy of an alkali metal with other metal(s), the alkali metal may preferably be in a proportion of from 6 to 30 mol %. An alloy containing an alkali metal in a proportion less than 6% can not bring about a sufficiently low work function, and that in a proportion more than 30 mol % tends to be oxidized or corroded.

Figure 10:
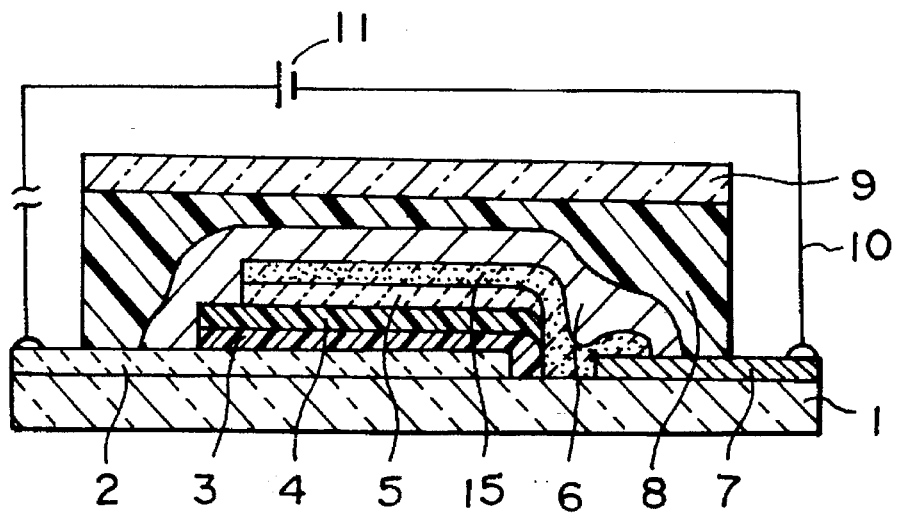

The alkali-metal-containing cathode with a low work function may have a thickness enough to efficiently carry out electron injection, which is about 50 nm or less. Accordingly, it is preferable to first form the alkali-metal-containing cathode in a thickness of about 1 to 50 nm and to form thereon, as shown in FIG. 10, a hard-corrosive metal layer 15 comprising a material more hardly corrosive than the alkali metal, in order to improve anti-corrosion and improve conductivity of the cathode.

As materials for such a hard-corrosive metal layer 15, metallic elements other than alkali metal elements and alkaline earth metal elements larger than the 4th period can be used, as exemplified by Mg, Sn, Al, In, Ni, Cu, Ag, Au, Pt and Zn.

The cathode 5 can be formed on the OEL 4 or EITL 12 by known methods. When, for example, the cathode 5 is formed using an alloy comprising a plurality of metallic elements, it can be co-deposited from separate deposition sources for every components, by resistance heating in an environment with a vacuum degree on the order of $10^{-5}$ Torr or less while monitoring the thickness by means of a quartz oscillation type thickness monitor. Alternatively, it can be formed using an alloy target by electron beam deposition, ion plating or sputtering.

The cathode 5 may preferably be formed in a thickness of from 0.01 to 0.3 μm.

The sealing layer 6 is a layer for preventing oxidation deterioration of the organic matters or the cathode that constitutes the organic EL device. Such a sealing layer 6 may preferably be formed of an inorganic compound including metal oxides such as $SiO_2$, SiO, GeO, $TeO_2$, $Sb_2O_3$, SnO, $B_2O_3$, $MoO_3$ and ZnO, metal fluorides such as $MgF_2$, LiF, $BaF_2$, $AlF_3$, $FeF_3$ and $CaF_2$, and metal sulfides such as GaS, SnS and ZnS, which have excellent gas barrier properties and water-vapor barrier properties. These may be used in the form of a single material or a compound material.

The sealing layer 6 can be formed using the above inorganic compound on the cathode 5 by known methods. For example, it can be formed by deposition, sputtering, ion plating or plasma-assisted CVD. When the layer is deposited by resistance heating, it is preferable to use GeO that can be deposited at low boat temperatures.

The cathode 5 tends to deteriorate when pinholes are present in the sealing layer 6, and hence it is more preferable to form the sealing layer 6 by using a plasma process such as ion plating or plasma-assisted vacuum deposition, which can form films with less pinholes.

In order to more efficiently protect the cathode 5, a layer comprising a mixture of the inorganic compound constituting the sealing layer 6 with an alkali metal or an alkaline earth metal such as Ca may be provided in the sealing layer 6 or on the surface of the sealing layer on the cathode 5 side.

The adhesive layer 8 is a layer for preventing moisture from percolating the organic EL device, together with the surface protective member 9 laminated thereto, and can be formed of a commercially available photo-curable adhesive, epoxy type adhesive or silicone type adhesive with a low moisture absorption and of a non-solvent type.

The surface protective member 9 is a layer that protects the whole organic EL device. A highly hermetic and highly rigid material such as a glass sheet, a metal sheet, hard aluminum foil or a plastic sheet can be used for this purpose.

The cathode withdrawing conductive layer 7, the anode withdrawing conductive layer 13, the lead 19 and the power source may each have the same construction as those of conventional organic EL devices.

The organic EL device of the present invention constructed as described above emits light upon application of direct voltages to the anode and the cathode. Even upon application of an alternating voltage, it emits light as long as a positive voltage is applied to the anode. Two-dimensional arrangement of organic EL devices can provide a thin-body display device capable of displaying characters or images.

The organic EL device of the present invention causes a photovoltaic effect in such a way that an electrode on the side of the HITL irradiated with light of a light absorption region of the OEL turns positive, and functions also as a photoelectric cell.

In the organic EL device of the present invention, an anode semitransparent to visible light and comprised of a single metal such as gold, platinum or palladium or an alloy thereof may be used or an anode comprising ITO formed on a dielectric multi-layer reflector formed by alternately depositing materials such as SiO and $TiO_2$ having differences in refractive indexes, each in a thickness of ¼ of electroluminescent wavelength, may be used, a cathode opaque to visible light and having a high reflectance may be used, and the distance between the anode and the cathode may be set to be integer times of ¼ of electroluminescent wavelength so that optical resonance can be set up, whereby EL spectra having a narrow half-width can be obtained.

EXAMPLES

The present invention will be described below in greater detail by giving Examples.

Example 1

First, using a 1.1 mm thick glass sheet as a transparent insulating substrate, ITO was coated thereon in a thickness of 120 nm by sputtering to form an anode. After the resulting transparent conductive glass substrate was thoroughly cleaned by washing with water and plasma cleaning before use, TPD was vacuum-deposited in a thickness of 50 nm as an HITL. Next, $Alq_3$ was vacuum-deposited in a thickness of 50 nm as an OEL. On the top surface thereof, an Mg-Na alloy was vacuum-deposited by codeposition as a cathode in a thickness of 9.5 nm so as for the Na to be in a proportion of 23 mol %, and thereafter only Mg was subsequently vacuum-deposited as a hard-corrosive metal layer in a thickness of 214 nm. The work function of the cathode was measured by the photoelectric emission method to find that it was 3.2 eV.

Finally, as a sealing layer, GeO was vacuum-deposited in a thickness of 1.8 μm, and thereafter a glass sheet serving as a surface protective member was bonded with an ultraviolet-curable adhesive to effect sealing. The device thus obtained began to emit light with a yellow-green color from 3 V upon application of a direct voltage from 1 V at a voltage applying rate of 1 V/8 sec by 1 V step, and showed a luminance of 10,200 $cd/m^2$ at 13 V. At this time, current density was 536 $mA/cm^2$.

Example 2

In the same manner as in Example 1, the HITL and the OEL were successively vacuum-deposited on the transparent conductive glass, and an Mg-Li alloy was vacuum-deposited thereon as a cathode in a thickness of 220 nm so as for the Li to be in a proportion of 26 mol %. The work function of the cathode was measured by the photoelectric emission method to find that it was about 3.1 eV. Finally, as a sealing layer, LiF was vacuum-deposited in a thickness of 1 μm.

The device thus obtained emitted light with a yellow-green color upon application of a direct voltage of 3 V or more and showed a luminance of 11,123 cd/m$^2$ at 17 V. At this time, current density was 399 mA/cm$^2$.

On the cathode surface of this device, a pressure-sensitive tape was stuck to make a peel test. As a result, different from the case in which the Mg-Ag alloy was used in the cathode, the OEL peeled off together with the cathode, showing that the adhesion between the OEL and the cathode was stronger than the case in which the Mg-Ag alloy was used in the cathode.

Example 3

In the same manner as in Example 1, the HITL was vacuum-deposited on the transparent conductive glass. Thereafter, Alq$_3$ containing 0.5 mol % of coumarin 540 was vacuum-deposited in a thickness of 50 nm. On the top surface thereof, an Mg-Li alloy was vacuum-deposited by codeposition as a cathode in a thickness of 10 nm so as for the Li to be in a proportion of 26 mol %, and thereafter only Mg was subsequently vacuum-deposited in a thickness of 210 nm. Finally, as a sealing layer, GeO was vacuum-deposited in a thickness of 2 μm, and thereafter a glass sheet serving as a surface protective member was bonded with an ultraviolet-curable adhesive to effect sealing. The device thus obtained emitted light with a green color at 3 V or more in the air and showed a luminance of 23,500 cd/m$^2$ at 14 V. At this time, current density was 510 mA/cm$^2$. This device performed uniform surface electroluminescence for 3 months or more without causing any dark spots even in the air.

Example 4

In the same manner as in Example 1, the HITL and the OEL were successively vacuum-deposited on the transparent conductive glass, and an Al-Li alloy was vacuum-deposited thereon as a cathode in a thickness of 220 nm so as for the Li to be in a proportion of 28 mol %. The work function of the cathode was measured by the photoelectric emission method to find that it was about 3.2 eV. Finally, as a sealing layer, LiF was vacuum-deposited in a thickness of 0.7 μm.

The device thus obtained emitted light with a yellow-green color at 3 V or more and showed a luminance of 10,322 cd/m$^2$ at 17 V. At this time, current density was 341 mA/cm$^2$.

Comparative Example 1

In the same manner as in Example 1, the HITL and the OEL were successively vacuum-deposited on the transparent conductive glass, and an Mg-Ag alloy was vacuum-deposited thereon as a cathode so as for the Ag to be in a proportion of 12 mol %. The work function of the cathode was measured by the photoelectric emission method to find that it was about 3.8 eV. Finally, as a sealing layer, MgF$_2$ was vacuum-deposited in a thickness of 0.3 μm.

The device thus obtained emitted light with a yellow-green color at 3 V or more and showed a luminance of 5,990 cd/m$^2$ at 17 V. Current density was 268 mA/cm$^2$.

Example 5

First, using a 1.1 mm thick soda-lime glass sheet as a transparent insulating substrate, ITO was coated thereon in a thickness of 120 nm to form an anode.

Figure 11:
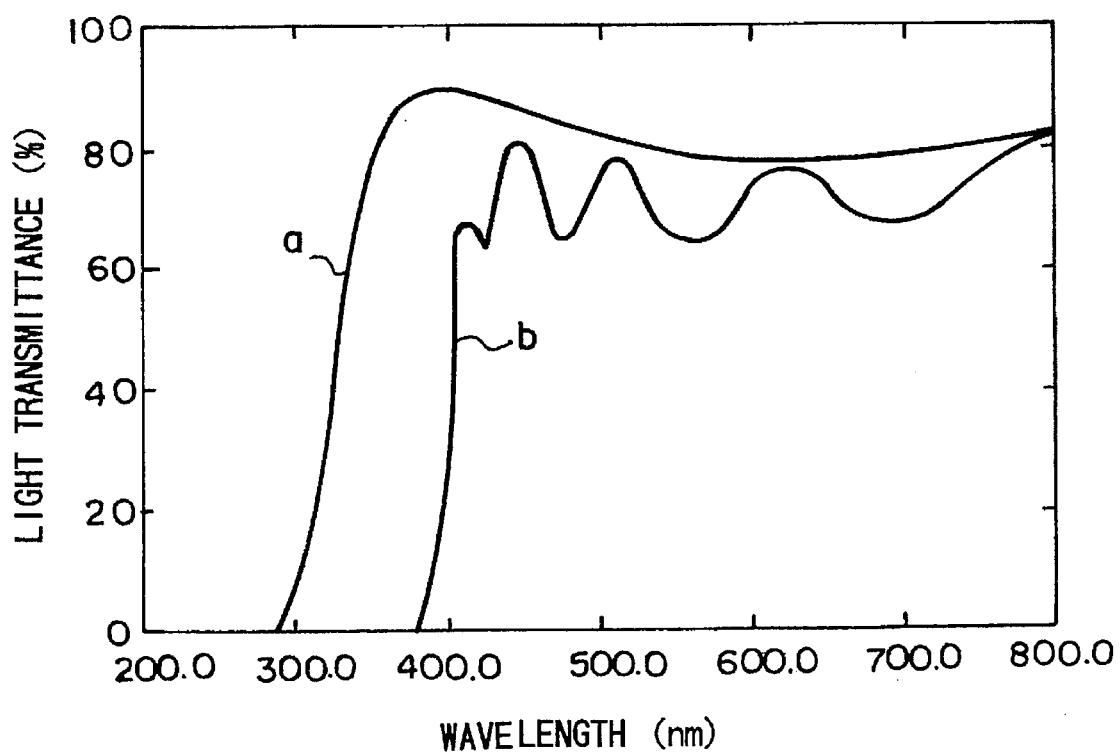
FIG. 11 shows transmission spectra of a glass substrate.

A transmission spectrum of this glass is shown in FIG. 11 by a solid line a.

Next, on the glass surface on its side opposite to the ITO-coated surface, a zinc oxide thin film was formed in a thickness of 600 nm by sputtering to provide a layer containing a metal oxide.

A transmission spectrum after the formation of the zinc oxide thin film is shown in FIG. 11 by a solid line b.

After the resulting transparent conductive glass substrate was thoroughly cleaned, TPD was vacuum-deposited in a thickness of 50 nm as an HITL. Next, Alq$_3$ was vacuum-deposited in a thickness of 50 nm as an OEL. On the top surface thereof, an Mg-Li alloy was vacuum-deposited by codeposition as a cathode in a thickness of 10 nm so as for the Li to be in a proportion of 26 mol %, and thereafter only Mg was subsequently vacuum-deposited in a thickness of 210 nm. Finally, as a sealing layer, GeO was vacuum-deposited in a thickness of 2 μm, and thereafter a glass sheet was bonded with an ultraviolet-curable adhesive to effect sealing.

The device thus obtained emitted light with a green color upon being driven at a direct current of 40 mA/cm$^2$, showing a luminance of 1,590 cd/m$^2$. The device was exposed to diffracted zero-order rays of a Shimadzu RF-5000 type spectro-fluorophotometer (light source: a xenon lamp of 150 W) at a slit width of 10 nm for 10 minutes keeping the anode and the cathode in on-state. As a result, its luminance decreased to 1,020 cd/m$^2$ at a current density of 40 mA/cm$^2$ in direct current, exhibiting less deterioration.

Example 6

First, using a 1.1 mm thick glass sheet as a transparent insulating substrate, ITO was coated thereon in a thickness of 120 nm to form an anode. The resulting transparent conductive glass substrate was cleaned with alcohol, and thereafter heated at about 400° C. for 10 minutes to carry out degreasing. Then, TPD was vacuum-deposited in a thickness of 75 nm as an HITL. Next, Alq$_3$ was vacuum-deposited in a thickness of 75 nm as an OEL. On the top surface thereof, an Mg-Ag alloy (molar ratio: 9:1) was vacuum-deposited by codeposition as a cathode in a thickness of 0.2 nm. Finally, as a sealing layer, GeO was vacuum-deposited in a thickness of 0.7 μm through O$_2$ plasma with an atmospheric pressure of 3×10$^{-4}$ Torr and an RF output power of 50 W.

The EL device thus obtained was stored in an environment of temperature 40° C. and relative humidity 90% to measure its luminance at given intervals in constant voltage drive under application of a direct current of 10 V. As a result, the half-life of luminance was about 55 minutes.

Comparative Example 2

In the same manner as in Example 1, the HITL and the OEL were successively vacuum-deposited on the transparent conductive glass, and GeO was vacuum-deposited thereon as a sealing layer in a thickness of 0.7 μm.

The EL device thus obtained was stored in an environment of temperature 40° C. and relative humidity 90% to measure its luminance at given intervals in constant voltage drive under application of a direct current of 10 V. As a result, the half-life of luminance was about 35 minutes. Also, non-electroluminescent dark spotted regions considered due to deterioration of the cathode were more seen.

Example 7

In the same manner as in Example 6, the HITL and the OEL were formed on the transparent conductive glass, and an Mg-Ag alloy (molar ratio: 9:1) was vacuum-deposited by codeposition as a cathode in a thickness of 0.2 nm. Finally, as a sealing layer, SiO was vacuum-deposited in a thickness of 0.2 μm through $O_2$ plasma with an atmospheric pressure of $3\times10^{-4}$ Torr and an RF output power of 50 W.

The EL device thus obtained was stored in an environment of temperature 40° C. and relative humidity 90% to measure its luminance at given intervals in constant voltage drive under application of a direct current of 10 V. As a result, the half-life of luminance was about 70 minutes.

Comparative Example 3

In the same manner as in Example 7, the HITL, the OEL and the cathode were successively vacuum-deposited on the transparent conductive glass, and SiO was vacuum-deposited thereon as a sealing layer in a thickness of 0.2 μm.

The EL device thus obtained was stored in an environment of temperature 40° C. and relative humidity 90% to measure its luminance at given intervals in constant voltage drive under application of a direct current of 10 V. As a result, the half-life of luminance was about 25 minutes. Also, non-electroluminescent dark spotted regions considered due to deterioration of the cathode were more seen.

Example 8

In the same manner as in Example 7, the HITL, the OEL and the cathode were successively vacuum-deposited on the transparent conductive glass, and LiF was vacuum-deposited thereon as a sealing layer in a thickness of 0.3 μm through Ar plasma with an atmospheric pressure of $3\times10^{-4}$ Torr and an RF output power of 50 W.

The EL device thus obtained was stored in an environment of temperature 40° C. and relative humidity 90% to measure its luminance at given intervals in constant voltage drive under application of a direct current of 10 V. As a result, the half-life of luminance was about 55 minutes.

Comparative Example 4

In the same manner as in Example 7, the HITL, the OEL and the cathode were successively vacuum-deposited on the transparent conductive glass, and LiF was vacuum-deposited thereon as a sealing layer in a thickness of 0.3 μm.

The EL device thus obtained was stored in an environment of temperature 40° C. and relative humidity 90% to measure its luminance at given intervals in constant voltage drive under application of a direct current of 10 V. As a result, the half-life of luminance was about 40 minutes. Also, non-electroluminescent dark spotted regions considered to be due to deterioration of the cathode were prevalent.

Example 9

In the same manner as in Example 7, the HITL, the OEL and the cathode were successively vacuum-deposited on the transparent conductive glass, and $MgF_2$ was vacuum-deposited thereon as a sealing layer in a thickness of 0.2 μm through Ar plasma, under plasma with an atmospheric pressure of $3\times10^{-4}$ Torr and an RF output power of 50 W.

The EL device thus obtained was stored in an environment of temperature 40° C. and relative humidity 90% to measure its luminance at given intervals in constant voltage drive under application of a direct current of 10 V. As a result, the half-life of luminance was about 60 minutes.

Comparative Example 5

In the same manner as in Example 7, the HITL, the OEL and the cathode were successively vacuum-deposited on the transparent conductive glass, and $MgF_2$ was vacuum-deposited thereon as a sealing layer in a thickness of 0.2 μm.

The EL device thus obtained was stored in an environment of temperature 40° C. and relative humidity 90% to measure its luminance at given intervals in constant voltage drive under application of a direct current of 10 V. As a result, the half-life of luminance was about 35 minutes. Also, non-electroluminescent regions considered due to deterioration of the cathode were more seen.

Example 10

Using a 1.1 mm thick soda-lime glass sheet as a transparent insulating substrate, ITO was coated thereon in a thickness of 120 nm by sputtering to form an anode. After the resulting transparent conductive glass substrate was thoroughly cleaned by washing with water and plasma cleaning before use, CuPc was vacuum-deposited in a thickness of 15 nm as a first HITL. Next, as a second HITL, a toluene solution of P1 (60 mg/5 ml) was spin-coated at 1,000 rpm to form a film in a thickness of 72 nm.

Next, $Alq_3$ was vacuum-deposited in a thickness of 50 nm as an OEL. On the top surface thereof, Mg and Ag in a molar ratio of 9:1 were vacuum-deposited as a cathode in a thickness of 220 nm. Finally, as a sealing layer, GeO was vacuum-deposited in a thickness of 1.8 μm, and thereafter a glass sheet was bonded with an ultraviolet-curable adhesive to effect sealing.

The device thus obtained emitted light with a green color upon application of a direct voltage of 3 V or more end showed a maximum luminance of 385 cd/m$^2$ at 12 V. At this time, current density was 94 mA/cm$^2$.

Example 11

A device was fabricated in the same manner as in Example 10 except that, as the second HITL of the device of Example 10, a layer in which P1 was replaced with P3 was formed in a thickness of 57 nm.

This device emitted light upon application of a direct voltage of 4 V or more and showed a maximum luminance of 514 cd/m$^2$ at 16 V. At this time, current density was 121 mA/cm$^2$.

Example 12

A device was fabricated in the same manner as in Example 10 except that the first and second HITLs of the device of Example 10 were replaced with a single layer HITL formed by spin-coating a chloroform solution of P9 (41 mg/5 ml) at 1,000 rpm in a thickness of 55 nm.

This device showed a maximum luminance of 1,153 cd/m$^2$ at 21 V. At this time, current density was 115 mA/cm$^2$.

Example 13

A device was fabricated in the same manner as in Example 12 except that the P9-containing HITL of the device of Example 12 was replaced with a single layer HITL formed by spin-coating a toluene solution of P8 (60 mg/5 ml) at 1,000 rpm in a thickness of 45 nm.

This device showed a maximum luminance of 4,023 cd/m$^2$ at 15 V. At this time, current density was 270 mA/cm$^2$.

Example 14

As the second HITL of the device of Example 10, a layer in which P1 was replaced with P2 was formed in a thickness of 48 nm. Thereafter, as an OEL, $Alq_3$ containing 0.5 mol % of C6 was vacuum-deposited in a thickness of 50 nm. On the top surface thereof, a cathode comprising Al and Li in a molar ratio of 5:1 was formed in a thickness of 40 nm, and thereafter only Al was deposited in a thickness of 170 nm. The subsequent procedure in Example 10 was repeated to produce a device.

This device emitted light at 3 V or more and showed a maximum luminance of 7,926 cd/m$^2$ at 10 V. At this time, current density was 434 mA/cm$^2$.

This device was also driven at a constant current density of 20 mA/cm$^2$, where its initial luminance was 560 cd/m$^2$ at 6.1 V and luminance half-life of luminance was about 6 hours.

Example 15

A device was fabricated in the same manner as in Example 14 except that, in place of the OEL of the device of Example 14, a layer was formed in a thickness of 5 nm by codeposition of Alq$_3$ containing 0.5 mol % of Qd, and thereafter Alq$_3$ was vacuum-deposited as an EITL in a thickness of 45 nm. The subsequent procedure in Example 14 was repeated to produce the device.

This device emitted light at 3 V or more and showed a luminance of 5,980 cd/m$^2$ at 10 V and a current density of 184 mA/cm$^2$. Its maximum luminance was 11,090 cd/m$^2$ at 12 V, and current density was 649 mA/cm$^2$.

This device was also driven at a constant current density of 20 mA/cm$^2$ where its initial luminance was 675 cd/m$^2$ at 7.5 V and luminance half-life of luminance was about 0.6 hours.

Example 16

A device was fabricated in the same manner as in Example 14 except that, as a third HITL provided between the second HITL and the OEL of the device of Example 14, TPD was vacuum-deposited in a thickness of 5 nm.

This device emitted light at 3 V or more, and showed a maximum luminance of 18,310 cd/m$^2$ at 11 V. At this time, current density was 434 mA/cm$^2$.

Example 17

A device was fabricated in the same manner as in Example 16 except that no Qd was used in the OEL.

This device emitted light at 3 V or more, and showed a maximum luminance of 12,300 cd/m$^2$ at 13 V. At this time, current density was 593 mA/cm$^2$.

Example 18

A device was fabricated in the same manner as in Example 17 except that, in place of P8 of the second HITL of the device of Example 17, TPD was vacuum-deposited in a thickness of 50 nm, and the third HITL was not provided.

This device emitted light at 3 V or more, and showed a maximum luminance of 14,120 cd/m$^2$ at 14 V. At this time, current density was 634 mA/cm$^2$.

Test Example

To compare drive deterioration characteristics at room temperature in an ambient atmosphere, devices were driven at a direct constant current density of 10 mA/cm$^2$ in respect of Example 16, and 40 mA/cm$^2$ in respect of Examples 17 and 18, to measure changes in applied voltage and luminance. Results are shown together in Tables 4 and 5. In Examples 16 and 17, the rise of voltage and deterioration of luminance were controllable because of the insertion of the P8 layer as the second HITL or the TPD layer as the third HITL and the lifetime of the EL devices was elongated because of the device tending to cause no insulation failure.

TABLE 4

| Cell | Luminance (cd/m$^2$) | | | | | | |
|---|---|---|---|---|---|---|---|
| | 0.1 | 50 | 100 | 360 | 1,000 | 2,000 | 2,580 (hrs) |
| Ex.16 | 587 | 442 | 324 | 242 | 184 | no meas. | |
| Ex.17 | 1,059 | 535 | 435 | 280 | 170 | 102 | 75* |
| Ex.18 | 942 | 690 | 540 | 242* | — | — | — |

*Breakdown

TABLE 5

| Cell | Bias voltage (V) | | | | | | |
|---|---|---|---|---|---|---|---|
| | 0.1 | 50 | 100 | 360 | 1,000 | 2,000 | 2,580 (hrs) |
| Ex.16 | 8.6 | 9.4 | 9.7 | 10.3 | 11.2 | no meas. | |
| Ex.17 | 8.8 | 9.9 | 10.2 | 11.5 | 13.0 | 14.5 | 15.0* |
| Ex.18 | 8.5 | 9.3 | 10.1 | 12.9* | — | — | — |

*Breakdown

What is claimed is:

1. An organic electroluminescent device comprising:
   a substrate;
   a multilayered structure formed on the substrate, comprised of an anode layer, an organic electroluminescent layer and a cathode layer,
   the multilayered structure being formed successively on the substrate in the order anode layer, organic electroluminescent layer, cathode layer, or in the order cathode layer, organic electroluminescent layer, anode layer; and
   a sealing layer formed on the multilayered structure, comprised of at least one compound selected from the group consisting of a metal oxide, a metal fluoride and a metal sulfide.

2. The organic electroluminescent device according to claim 1, wherein a hole injecting and transporting layer is provided between the anode layer and the organic electroluminescent layer, and on said substrate the anode layer, the hole injecting and transporting layer, the organic electroluminescent layer, the cathode layer and the sealing layer are deposited in this order.

3. The organic electroluminescent device according to claim 2, wherein an electron injecting and transporting layer is further provided between the organic electroluminescent layer and the cathode layer.

4. The organic electroluminescent device according to claim 1, wherein a hole injecting and transporting layer is provided between the anode layer and the organic electroluminescent layer, and on said substrate the cathode layer, the organic electroluminescent layer, the hole injecting and transporting layer, the anode layer and the sealing layer are deposited in this order.

5. The organic electroluminescent device according to claim 4, wherein an electron injecting and transporting layer is further provided between the organic electroluminescent layer and the cathode layer.

6. The organic electroluminescent device according to claim 1, wherein said metal oxide is selected from the group consisting of SiO$_2$, SiO, GeO, TeO$_2$, Sb$_2$O$_3$, SnO, B$_2$O$_3$ and MoO$_3$, said metal fluoride is selected from the group consisting of MgF$_2$, LiF, BaF$_2$, AlF$_3$, CaF$_2$ and FeF$_3$, and said metal sulfide is selected from the group consisting of GeS, SnS and ZnS.

7. The organic electroluminescent device according to claim 1, wherein said sealing layer is deposited by using a plasma process.

8. An organic electroluminescent device, comprising:
   a substrate;
   a multilayered structure formed on the substrate, comprised of anode layer, an organic electroluminescent layer, and an cathode layer,
   the multilayered structure being formed successively on the substrate in the order anode layer, organic electroluminescent layer and cathode layer, or in the order cathode layer, organic electroluminescent layer and anode layer,
   said cathode layer comprising an alloy of an alkali metal element with another metallic element; and
   a sealing layer formed on the multilayer structure.

9. The organic electroluminescent device according to claim 8, wherein said alkali metal element is selected from the group consisting of Li, Na and K, and said other metallic element is selected from the group consisting of Mg, Al, In, Sn, Zn, Ag and Zr.

10. The organic electroluminescent device according to claim 8, wherein the alkali metal element in said alloy is in a content of from 6 mol % to 30 mol %.

11. The organic electroluminescent device according to claim 2, wherein a hard-corrosive metal layer is formed on said cathode layer.

12. The organic electroluminescent device according to claim 11, wherein said hard-corrosive metal layer comprises a metal selected from the group consisting of Mg, Sn, Al, In, Ni, Cu, Ag, Au, Pt and Zn.

13. The organic electroluminescent device according to claim 1, wherein an ultraviolet screening layer is further provided on at least one side of said substrate.

14. An organic electroluminescent device, comprising;
   a substrate: and
   a multilayered structure formed on the substrate, comprised of an anode layer, a hole injecting and transporting layer, an organic electroluminescent layer and a cathode layer,
   the multilayered structure being formed successively on the substrate in the order anode layer, hole injecting and transporting layer, organic electroluminescent layer and cathode layer, or in the order cathode layer, organic electroluminescent layer, hole injecting and transporting layer and anode layer,
   said hole injecting and transporting layer comprising a polyphosphazene compound having a hob injecting and transporting group, or said organic electroluminescent layer comprising a polyphosphazene compound having an electroluminescent group.

15. The organic electroluminescent device according to any one of claims 2 to 5, wherein at least said hole injecting and transporting layer, said organic electroluminescent layer or said electron injecting and transporting layer comprises a polyether compound or polyphosphate compound having an aromatic tertiary amine group in its main chain.

16. The organic electroluminescent device according to any one of claims 2 to 5, wherein said hole injecting and transporting layer is comprised of at least two layers and the work function changes between the anode layer and the organic electroluminescent layer so that the work function of a layer formed on the substrate differs from the layer previously formed on the substrate by a value of −0.2 eV or more, where a negative change represents a decrease in the work function from the layer previously formed and a positive change represents an increase in the work function from the layer previously formed.

17. The organic electroluminescent device according to claim 16, wherein, of two or more layers constituting said hole injecting and transporting layer, one layer coming into contact with said anode layer is formed of a phthalocyanine compound and has a thickness of from 1 nm to 30 nm.

18. The organic electroluminescent device according to claim 16, wherein, of two or more layers constituting said hole injecting and transporting layer, one layer coming into contact with said organic electroluminescent layer is formed of a low-molecular weight aromatic tertiary amine compound and has a thickness of from 1 nm to 30 nm.

19. The organic electroluminescent device according to claim 14, wherein at least one of said hole injecting and transporting layer and said organic electroluminescent layer is formed by coating a solution prepared by dissolving a corresponding polyphosphazene compound in an organic solvent, on the surface on which the layer is to be formed, followed by drying.

20. The organic electroluminescent device according to claim 15, wherein at least one of said hole injecting and transporting layer, said organic electroluminescent layer and said electron injecting and transporting layer is formed by coating a solution prepared by dissolving in an organic solvent a corresponding polyether compound or polyphosphate compound having an aromatic tertiary amine group in its main chain, on the surface on which the layer is to be formed, followed by drying.

21. The organic electroluminescent device according to claim 8, wherein the sealing layer is comprised of at least one compound selected from the group consisting of a metal oxide, a metal fluoride and a metal sulfide.

22. The organic electroluminescent device according to claim 14, further comprising a sealing layer formed on the multilayered structure.

23. The organic electroluminescent device according to claim 15, wherein the sealing layer is comprised of at least one compound selected form the group consisting of a metal oxide, a metal fluoride and a metal sulfide.

* * * * *

UNITED STATES PATENT AND TRADEMARK OFFICE
CERTIFICATE OF CORRECTION

PATENT NO. : 5,652,067
DATED : July 29, 1997
INVENTOR(S) : Yuichi ITO, et al.

It is certified that error appears in the above-identified patent and that said Letters Patent is hereby corrected as shown below:

<u>Column 3</u>
Line 23, "57" should be underlined.
<u>Column 11</u>
Line 24, "3,853,311" should be --3,873,311--.
<u>Column 12</u>
Line 1, "295,125" should be --295,127--. (2nd occurrence)
<u>Column 18</u>
Line 48, "St" should be --Sr--.
<u>Column 21</u>
Line 67, "a" should be underlined.
<u>Column 22</u>
Line 6, "b" should be underlined.
<u>Column 24</u>
Line 37, "P3" should be --P2--.

Signed and Sealed this

Twenty-third Day of December, 1997

Attest:

BRUCE LEHMAN

Attesting Officer

Commissioner of Patents and Trademarks